United States Patent
Huli et al.

(10) Patent No.: US 10,935,889 B2
(45) Date of Patent: Mar. 2, 2021

(54) EXTREME ULTRA-VIOLET SENSITIVITY REDUCTION USING SHRINK AND GROWTH METHOD

(71) Applicant: Tokyo Electron Limited, Tokyo (JP)

(72) Inventors: Lior Huli, Delmar, NY (US); Nihar Mohanty, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 687 days.

(21) Appl. No.: 15/152,950

(22) Filed: May 12, 2016

(65) Prior Publication Data

US 2016/0334709 A1 Nov. 17, 2016

Related U.S. Application Data

(60) Provisional application No. 62/160,795, filed on May 13, 2015.

(51) Int. Cl.
*G03F 7/40* (2006.01)

(52) U.S. Cl.
CPC .................... *G03F 7/40* (2013.01)

(58) Field of Classification Search
CPC ............................... G03F 7/20; G03F 7/2004
See application file for complete search history.

(56) References Cited

U.S. PATENT DOCUMENTS

| | | |
|---|---|---|
| 6,764,946 B1 | 7/2004 | Amblard |
| 7,670,760 B2 | 3/2010 | Shen et al. |
| 8,354,655 B2 | 1/2013 | Godet et al. |
| 8,501,395 B2 | 8/2013 | Dai et al. |
| 9,086,631 B2 | 7/2015 | Huli et al. |
| 9,097,977 B2 | 8/2015 | Kawakami |

(Continued)

FOREIGN PATENT DOCUMENTS

| | | |
|---|---|---|
| JP | 2005-302771 | 10/2005 |
| JP | 2008-147645 | 6/2008 |

(Continued)

OTHER PUBLICATIONS

Japanese Patent Application No. 2016-096228, "Official Action," filed May 12, 2016, Office Action dated Jun. 15, 2017.

(Continued)

*Primary Examiner* — Kathleen Duda
(74) *Attorney, Agent, or Firm* — Wood Herron & Evans LLP

(57) ABSTRACT

Provided is a method for patterning a substrate, comprising: forming a layer of radiation-sensitive material on a substrate; preparing a pattern in the layer of radiation-sensitive material using a lithographic process, the pattern being characterized by material structures having a critical dimension (CD) and a roughness; following the preparing the pattern, performing a shrink process to reduce the CD to a reduced CD; and performing a growth process to grow the reduced CD to a target CD. Roughness includes a line edge roughness (LER), a line width roughness (LWR), or both LER and LWR. Performing the shrink process comprises: coating the pattern with a hard mask, the coating generating a hard mask coated resist; baking the hard mask coated resist in a temperature range for a time period, the baking generating a baked coated resist; and developing the baked coated resist in deionized water.

20 Claims, 11 Drawing Sheets

(56) References Cited

U.S. PATENT DOCUMENTS

| | | |
|---|---|---|
| 2007/0207404 A1 | 9/2007 | Shen et al. |
| 2008/0295061 A1* | 11/2008 | Eisenmann ............ G03F 7/705 |
| | | 716/56 |
| 2011/0117490 A1* | 5/2011 | Bae ....................... G03F 7/0035 |
| | | 430/270.1 |
| 2012/0244458 A1 | 9/2012 | Luong et al. |
| 2013/0171571 A1 | 7/2013 | Dunn et al. |
| 2015/0243520 A1 | 8/2015 | Park et al. |

FOREIGN PATENT DOCUMENTS

| | | | |
|---|---|---|---|
| WO | 2013103482 A1 | 7/2013 | |
| WO | 2014/035871 | 3/2014 | |
| WO | WO 2014035871 A1 * | 3/2014 | ........... G03F 7/2004 |

OTHER PUBLICATIONS

Japan Patent Office, Office Action issued in related JP Application No. 2016-096228 dated Jan. 16, 2018, 11 pp. including English translation.

Chinese Patent Office, Third Office Action issued in CN 201610320265.9 dated Aug. 18, 2020.

Chinese Patent Office, Office Action in corresponding Chinese Patent Application No. 201610320265.9 dated Mar. 5, 2020.

\* cited by examiner

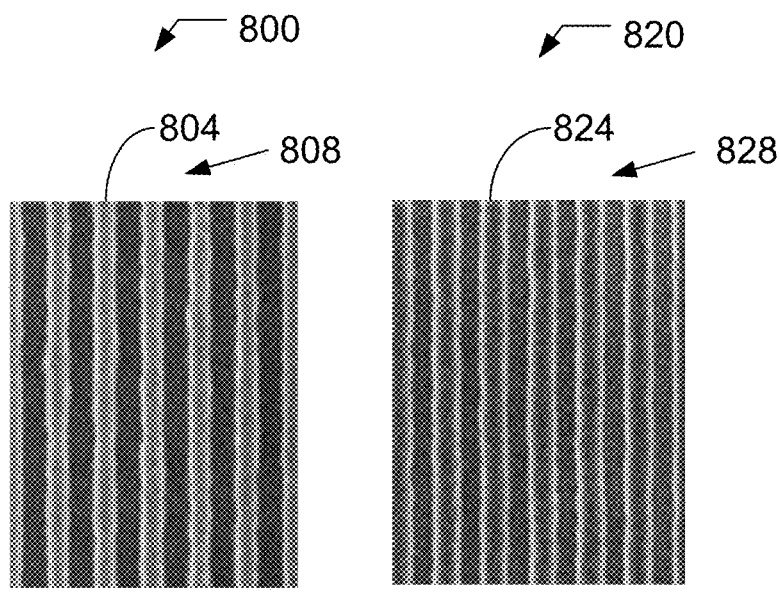
*FIG. 8A*   *FIG. 8B*
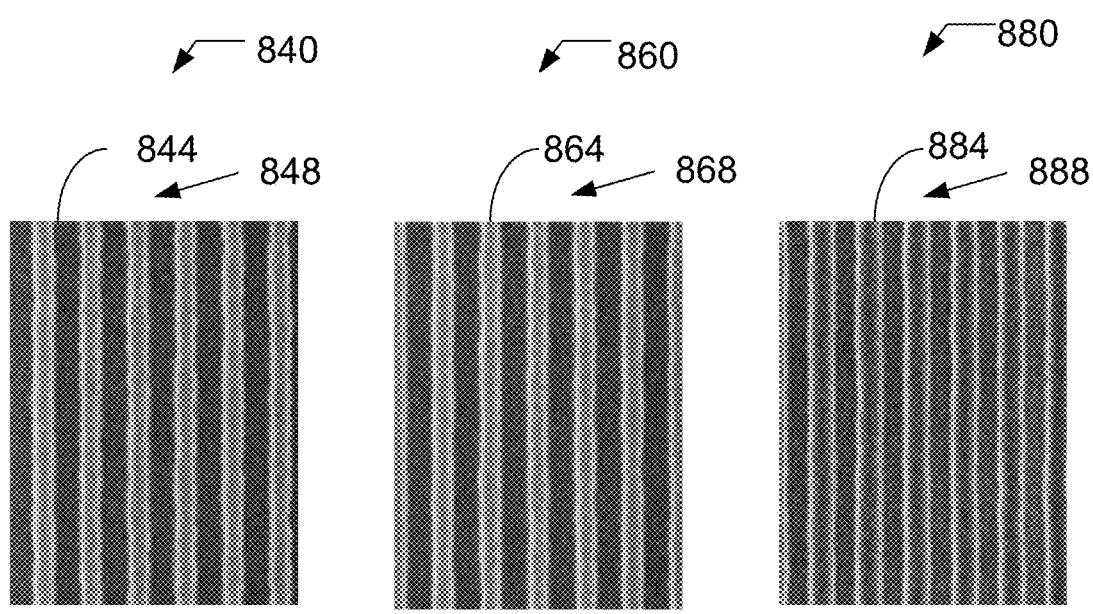
*FIG. 8C*   *FIG. 8D*   *FIG. 8E*

EXTREME ULTRA-VIOLET SENSITIVITY REDUCTION USING SHRINK AND GROWTH METHOD

BACKGROUND OF THE INVENTION

Field of Invention

The invention relates to a method and systems for patterning a thin film on a substrate, and more particularly to a method and system for reducing resist sensitivity and improving line width roughness and line edge roughness or contact edge roughness.

Description of Related Art

In material processing methodologies, pattern etching comprises the application of a layer of radiation-sensitive material, such as photo-resist, to an upper surface of a substrate, the formation of a pattern in the layer of radiation-sensitive material using photo-lithography, and the transfer of the pattern formed in the layer of radiation-sensitive material to an underlying thin film on the substrate using an etching process. The patterning of the radiation-sensitive material generally involves exposure of the radiation-sensitive material to a pattern of electromagnetic (EM) radiation using, for example, a photo-lithography system, followed by the removal of the irradiated regions of the radiation-sensitive material (as in the case of positive tone resist), or non-irradiated regions (as in the case of negative tone resist) using a developing solution.

As the critical dimension (CD) decreases, there is a need to increase the resolution of the pattern of EM radiation (Resolution) and the sensitivity of the resist (Sensitivity) while keeping the line width roughness (LWR) of the resulting pattern within acceptable limits. It is known in the art that there is a tradeoff relationship between Resolution, LWR, and Sensitivity, often called the LRS tradeoff triangle. Conventional techniques that seek to improve one of the three parameters often improve at the unacceptable expense of one or both of the other parameters. Extreme ultra violet (EUV) lithography shows promising results for feature sizes below 40 nm. However, EUV resist sensitivity is one of the challenges for EUV lithography. As noted in the LRS tradeoff above, it is very difficult to obtain simultaneous improvements in resolution, LWR, and sensitivity. Previous attempts included a sequence of steps that included a slimming process to reduce the CD to a reduced CD and a smoothing process to reduce the roughness to a reduced roughness. The demand for increased throughput without the increase in roughness associated with line and space structures and in contact edge roughness (CER) with contact holes continues. There is a continuing need for a method and system that allow further reduction of resist sensitivity significantly without impact to the LWR or CER and to the resolution in order to achieve an enabling throughput for EUV lithography.

SUMMARY OF THE INVENTION

Provided is a method for patterning a substrate, comprising: forming a layer of radiation-sensitive material on a substrate; preparing a pattern in the layer of radiation-sensitive material using a lithographic process, the pattern being characterized by material structures having a critical dimension (CD) and a roughness; following the preparing the pattern, performing a shrink process to reduce the CD to a reduced CD; and performing a growth process to grow the reduced CD to a target CD. Roughness includes a line edge roughness (LER), a line width roughness (LWR), or both LER and LWR. Performing the shrink process can comprise: coating the pattern with a hard mask, the coating generating a hard mask coated resist; baking the hard mask coated resist in a temperature range for a time period, the baking generating a baked coated resist; and developing the baked coated resist in deionized water.

Also provided is a system for patterning a substrate, comprising: a patterning system comprising a process chamber coupled to a plasma generator, an etchant gas delivery system, a controller, a power source, a heating system, a cooling system, and a vacuum system; wherein the patterning system is configured to form a layer of radiation-sensitive material on the substrate; to prepare a pattern in the layer of radiation-sensitive material using a lithographic process, the pattern being characterized by material structures having a critical dimension (CD) and a roughness; following the preparing the pattern, to perform a shrink process to reduce the CD to a reduced CD; and to perform a growth process to grow the reduced CD to a target CD; wherein the roughness in a line and space pattern includes a line edge roughness (LER), a line width roughness (LWR), or both LER and LWR; and wherein target sensitivity reduction and LER, LWR, or CER improvements in contact hole patterns are concurrently achieved in order to increase the substrate throughput of the patterning system.

BRIEF DESCRIPTION OF THE DRAWINGS

In the accompanying drawings:

FIG. 7A is an exemplary image of the side-view of structures after a CTO of 60 degrees C. for 60 seconds with an energy level of 17 mJ/cm$^2$ while FIG. 7B is an exemplary image of the side-view of structures after a CTO of 60 degrees C. for 60 seconds with an energy level of 20 mJ/cm$^2$;

FIG. 7C is an exemplary image of the side-view of structures after a CTO of 60 degrees C. for 60 seconds with an energy level of 17 mJ/cm$^2$ while

FIG. 8A is an exemplary image of the top-down view of structures that highlights the line width roughness baseline measurement post lithography;

FIG. 8B is an exemplary image of the top-down view of structures that highlights the line width roughness improvement post etch smoothing;

FIG. 8C is an exemplary image of the top-down view of structures that highlights the line width roughness baseline measurement post lithography;

FIG. 8D is an exemplary image of the top-down view of structures that highlights the line width roughness improvement post smoothing;

FIG. 8E is an exemplary image of the top-down view of structures that highlights the line width roughness improvement post etch regular smoothing;

DETAILED DESCRIPTION OF SEVERAL EMBODIMENTS

A method for patterning a substrate is disclosed in various embodiments.

However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

"Substrate" as used herein generically refers to the object being processed in accordance with embodiments of the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. In this application, the terms dose and energy are used interchangeably to mean the EUV radiation used to irradiate the EUV photo-resist. Furthermore, resist and photo-resist are used interchangeably to mean photo-resist.

Figure 1:
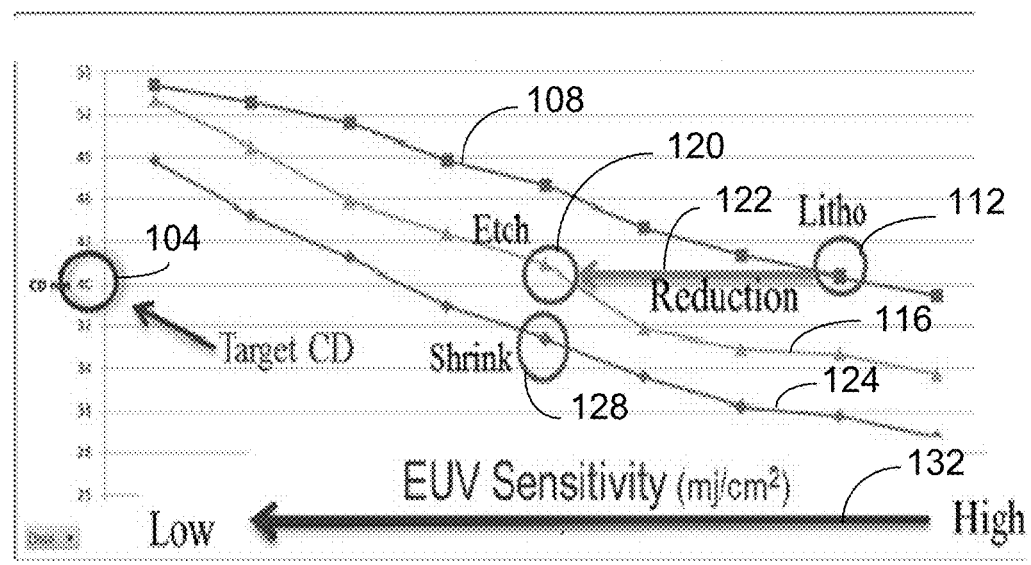
FIG. 1 presents an exemplary graph of the critical dimension (CD) of the structure in the process steps of a post lithographic process, a shrink process, and an etch process as a function of the EUV sensitivity in an EUV patterning process according to an embodiment.

Referring to FIG. 1, FIG. 1 presents an exemplary graph 100 of the critical dimension (CD) of the structure in the process steps of a post lithographic process, a shrink process, and an etch growth process as a function of the EUV sensitivity in an EUV patterning process according to an embodiment. The lithography curve 108 is a sloping downward curve starting from low EUV sensitivity at CD of about 54 nm down to about 40 nm for high EUV sensitivity. The shrink curve 124 is a sloping downward curve starting at a CD of about 53 nm at low EUV sensitivity to about 30 nm for high EUV sensitivity. The etch curve 116 is a sloping downward curve starting at about 53 nm CD at low EUV sensitivity to about 34 nm at high EUV sensitivity. The example in the graph identified by encircled points illustrates how a patterned structure with a target CD of about 40 nm after the lithography process is at about 40.5 nm, point 112, at high EUV sensitivity. After the shrink process, the shrinkage is more than the target CD 104, the structure is at about 36 nm, point 128, at a medium EUV sensitivity. The structure is grown in the etch growth process close to the target CD, point 120 in the etch curve 116. The reduction in EUV sensitivity is highlighted by line 122 from the lithography curve where the structure was at high EUV sensitivity, point 112, to the etch curve where the structure is at a medium EUV sensitivity, point 120.

Figure 2:
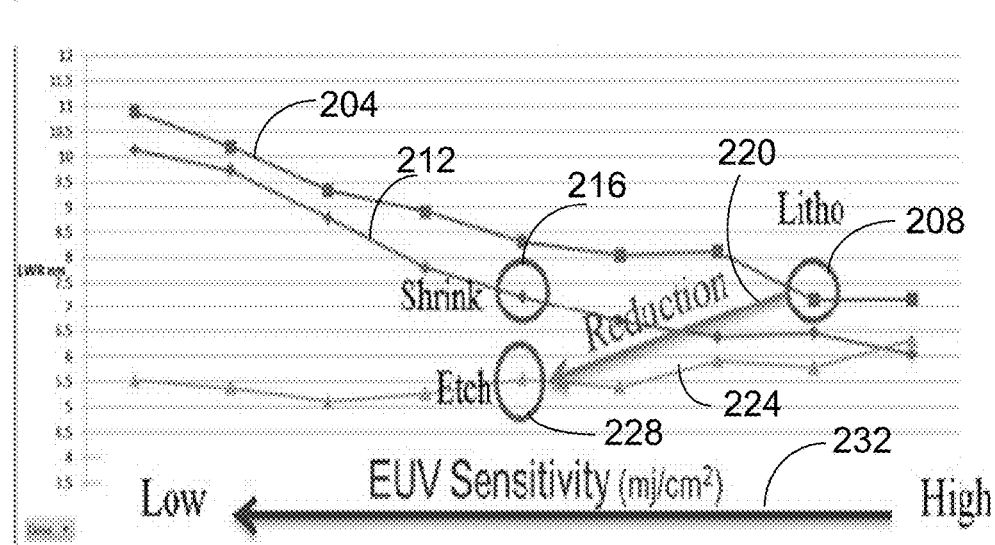
FIG. 2 presents an exemplary graph of the line width roughness of a structure in a post lithographic process, a shrink process, and an etch process as a function of the EUV sensitivity in an EUV patterning process according to an embodiment.

FIG. 2 presents an exemplary graph 200 of the line width roughness of a structure in a post lithographic process, a shrink process, and an etch growth process as a function of the EUV sensitivity in an EUV patterning process according to an embodiment. The lithography curve 204 is a downward sloping curve starting from low EUV sensitivity at LWR of about 10.9 nm down to about 7.2 nm at high EUV sensitivity. The shrink curve 212 is a downward sloping curve starting at an LWR of about 10.2 nm at low EUV sensitivity to about 6.0 nm at high EUV sensitivity. The etch curve 224 is a sloping-up curve starting at about 5.5 nm LWR at low EUV sensitivity to about 6.3 nm LWR at high EUV sensitivity. The example in the graph identified by encircled points illustrates a patterned structure starting at about 7.1 nm LWR, point 208, post lithography. After the shrink process, the LWR of the structure is at about 7.2 nm, point 216 in the shrink curve 212, at a medium EUV sensitivity. The structure is grown in the etch growth process where the LWR is reduced (improved) to about 5.5 nm, point 228 in the etch curve 224. The reduction in LWR is highlighted by line 220 from the lithography curve 204 where the structure was at high EUV sensitivity, point 208, the LWR is about 7.2 nm to the etch curve 224 where the structure is at a medium EUV sensitivity, point 228 where the LWR was reduced (improved) to about 5.5 nm.

Figure 3:
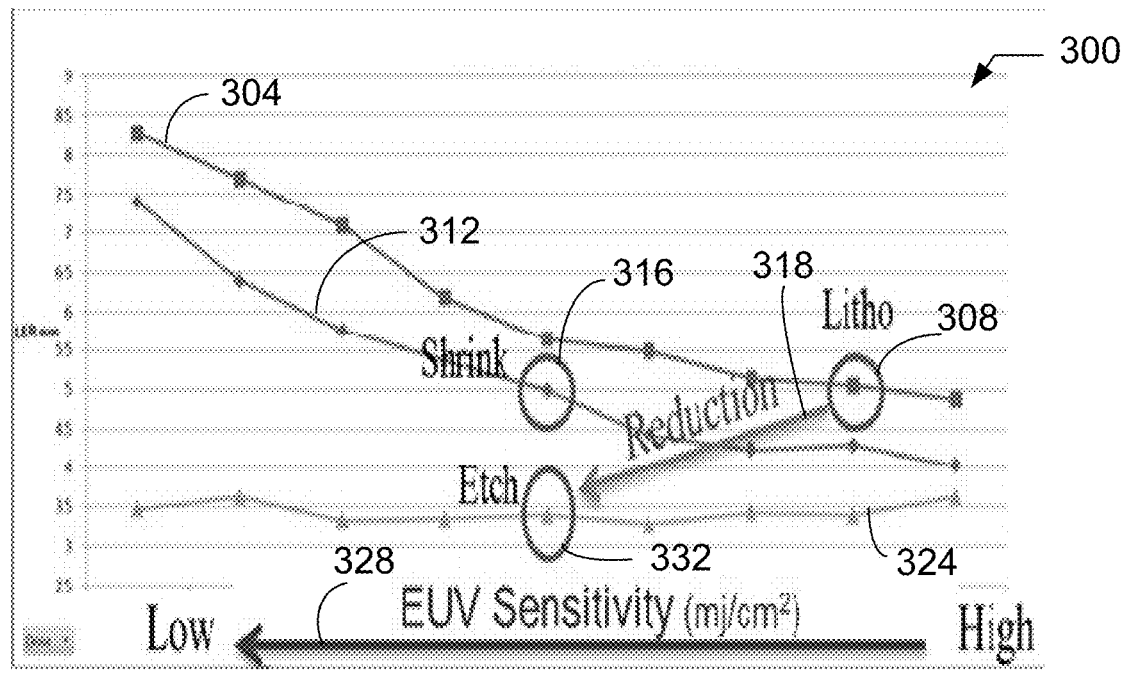
FIG. 3 presents an exemplary graph of the line edge roughness (LER) of a structure in the process steps of a post lithographic process, a shrink process, and an etch process as a function of the EUV sensitivity in an EUV patterning process according to an embodiment.

FIG. 3 presents an exemplary graph 300 of the line edge roughness (LER) of a structure in the process steps of a post lithographic process, a shrink process, and an etch growth process as a function of the EUV sensitivity in an EUV patterning process according to an embodiment. The lithography curve 304 is a downward sloping curve starting from low EUV sensitivity at LER of about 8.2 nm down to about 4.9 nm at high EUV sensitivity. The shrink curve 312 is a downward sloping curve starting at an LER of about 7.4 nm at low EUV sensitivity to about 4.0 nm at high EUV sensitivity. The etch curve 324 is a relatively flat curve starting at about 3.5 nm LER at low EUV sensitivity to about 3.6 nm LER at high EUV sensitivity. The example in the graph identified by encircled points illustrates a patterned structure starting at about 5.0 nm LER, point 308, post lithography. After the shrink process, the LER of the structure is at about 5.0 nm, point 316 in the shrink curve 312, at a medium EUV sensitivity. The structure is grown in the etch growth process where the LER is reduced (improved) to about 3.4 nm, point 332 in the etch curve 324. The reduction in LER is highlighted by line 318 from the lithography curve 304 where the structure was at high EUV sensitivity, point 308, had an LER of about 5.0 nm to the etch curve 324 where the structure is at a medium EUV sensitivity, point 332, and an LER is about 3.4 nm.

Figure 4:
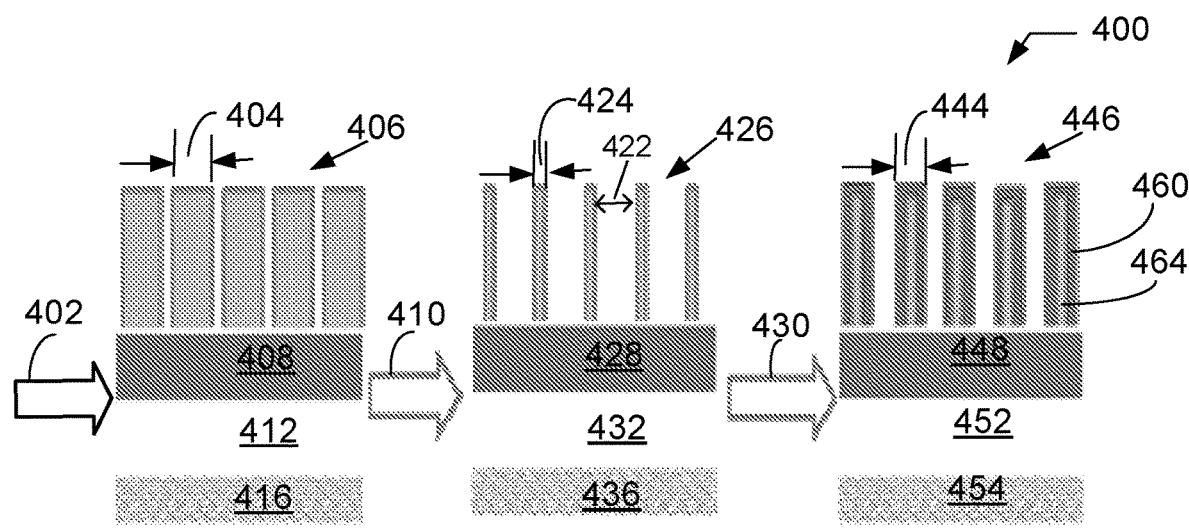
FIG. 4 depicts an exemplary simplified schematic of the shrink and growth process steps of a line and space structure in an EUV patterning process according to an embodiment.

FIG. 4 depicts an exemplary simplified schematic 400 of the flow of shrink and growth process steps of a line and space structure in an EUV patterning process according to an embodiment. The target CD of the line and space structure is selected based on the application and on empirical data collected for the application. The lithography process 402 is deliberately set to an underdose level by using less energy from the EUV source than the target energy to fabricate the target CD. The CD 404 of the structures 406 are set to be wider than the target CD by using less than the target mJ/cm$^2$. Given a certain energy output of the lithography equipment, the lesser energy used in the lithography step increases the substrate throughput in substrates per hour. Typical underlying layer includes a silicon anti-reflective layer 408, an advanced patterning film 412, and a target layer 416. In the shrink process 410, the structures 426 are shrunk more than the target CD and results in a smaller line 424 than the target CD and bigger space 422, the underlying layer including the silicon anti-reflective layer 428, the advanced patterning film 432, and the target layer 436. In the growth process 430, the structures 446 are grown to the target CD size 444 by adding material 460 to the lines 464, the underlying layer including the silicon anti-reflective layer 448, the advanced patterning film 452, and the target layer 454.

Figure 5:
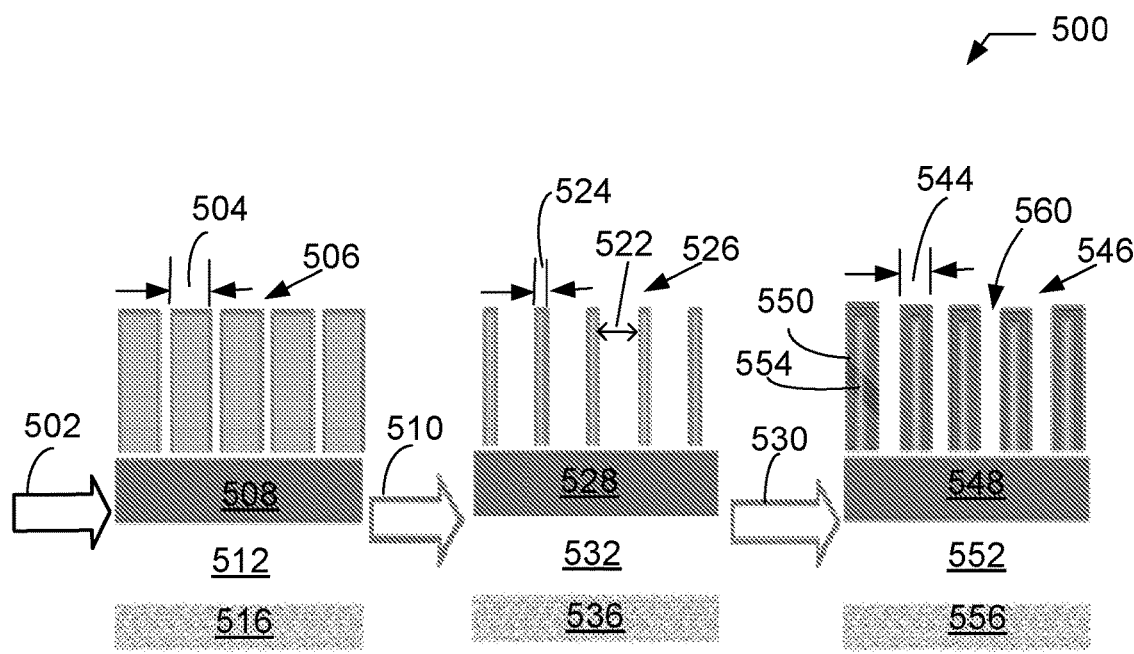
FIG. 5 depicts an exemplary simplified schematic of the shrink and growth process steps of a contact hole (C/H) structure in an EUV patterning process according to an embodiment.

FIG. 5 depicts an exemplary simplified schematic 500 of the flow of shrink and growth process steps of a contact hole (C/H) structure in an EUV patterning process according to an embodiment. The target CD of the C/H is selected based on the application and on empirical data collected for the application. The lithography process 502 is deliberately set to an underdose level by using less energy from the EUV source than the target energy to fabricate the target CD, this time the target CD is a contact hole. The CD 504 of the structures 506 between the holes are set to be wider to give a smaller hole than the target CD by using less than the target mJ/cm$^2$. As mentioned above, the lesser energy used in the lithography step increases the substrate throughput in substrates per hour. Typical underlying layer can include a silicon anti-reflective layer 508, an advanced patterning film 512, and a target layer 516. Other film stacks can also be used. In the shrink process 510, which may also be referred to as a CD growth process in the case of contact hole CD, the structures 526 are shrunk more than a target amount and result in a smaller structure 524 and bigger hole 522 than the target CD, the underlying layer including the silicon anti-reflective layer 528, the advanced patterning film 532, and the target layer 536. In the growth process 530, which may also be referred to as a CD shrink process in the case of a contact hole CD, the structures 546 are grown to the CD size 544 by adding material 550 to the structures 554 to give the target CD for the holes 560, the underlying layer including the silicon anti-reflective layer 548, the advanced patterning film 552, and the target layer 556.

Figure 6A:
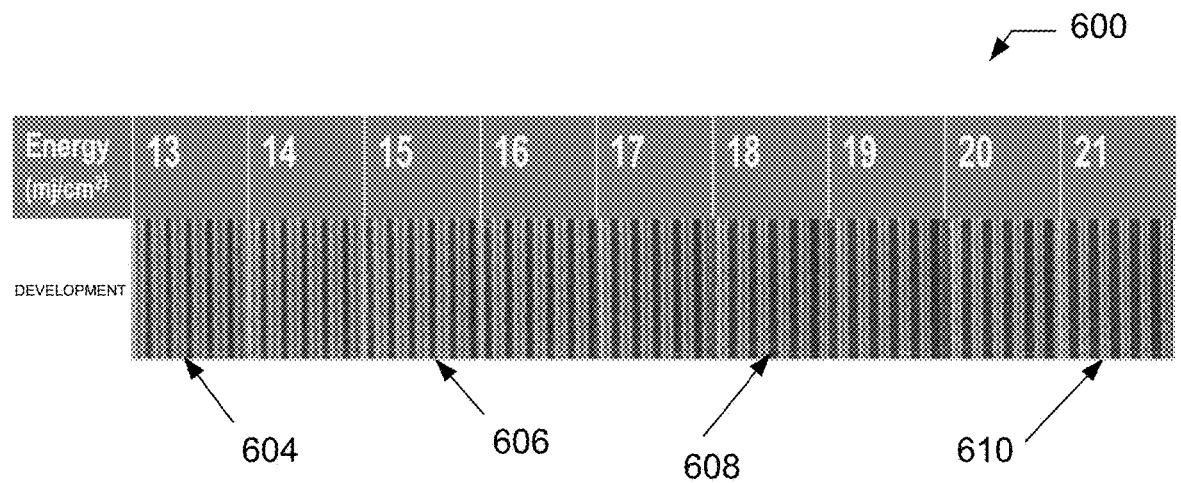
FIG. 6A is an exemplary image of the top-view of structures after the development process at different energy levels.

FIG. 6A is an exemplary image 600 of the top-view of structures after the patterning and development of the structures at different energy levels. The top-view of the structure 604 at 13 mJ/cm$^2$ has visually high LWR, the structure 606 after exposure to 15 mJ/cm$^2$ has a lower LWR, the structure 608 after exposure to 18 mJ/cm$^2$ has a still lower LWR, and the structure 610 after exposure to 21 mJ/cm$^2$ has the lowest LWR.

Figure 6B:
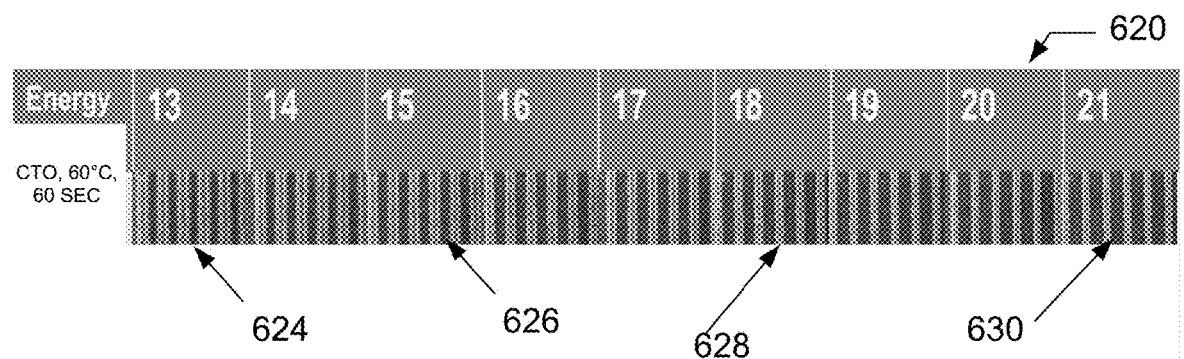
FIG. 6B is an exemplary image of the top-view of structures after the chemical trim overflow (CTO) process at different energy levels.

FIG. 6B is an exemplary image 620 of the top-view of structures after the chemical trim overflow (CTO) process of the structures at different energy levels where the structures were exposed to 60° C. for 60 seconds. The top-view of the structure 624 at 13 mJ/cm$^2$ has visually high LWR, the structure 626 after exposure to 15 mJ/cm$^2$ has a lower LWR, the structure 628 after exposure to 18 mJ/cm$^2$ has a still lower LWR, and the structure 630 after exposure to 21 mJ/cm$^2$ has the lowest LWR.

Figure 6C:
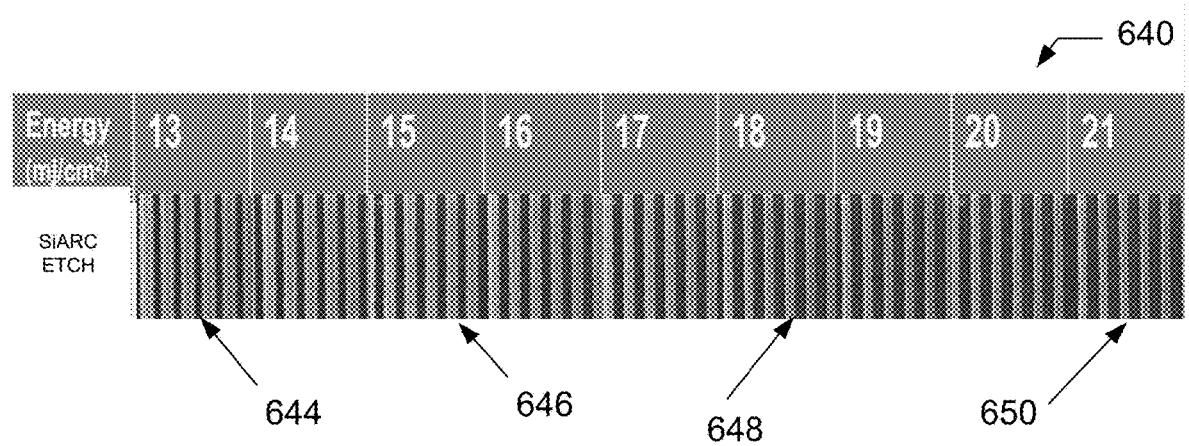
FIG. 6C is an exemplary image of the top-view of structures after the silicon anti-reflective coating etch process at different energy levels.

FIG. 6C is an exemplary image of the top-view of structures after the silicon anti-reflective coating etch of the structures at different energy levels. The top-view of the structure 644 at 13 mJ/cm$^2$ has visually high LWR, the structure 646 after exposure to 15 mJ/cm$^2$ has a lower LWR, the structure 648 after exposure to 18 mJ/cm$^2$ has a still lower LWR, and the structure 650 after exposure to 21 mJ/cm$^2$ has the lowest LWR.

Figure 7A:
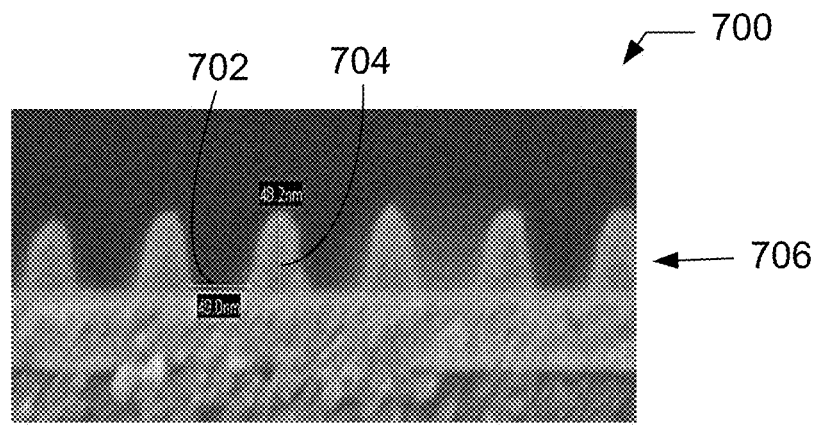

FIG. 7A is an exemplary image 700 of the side-view of structures 706 after a development process at an energy level of 20 mJ/cm$^2$. After development of the structures 706, the distance 702 between structures 706 was 49.0 nm while the height 704 of the structures 706 was 48.2 nm.

Figures 7B, 7C:
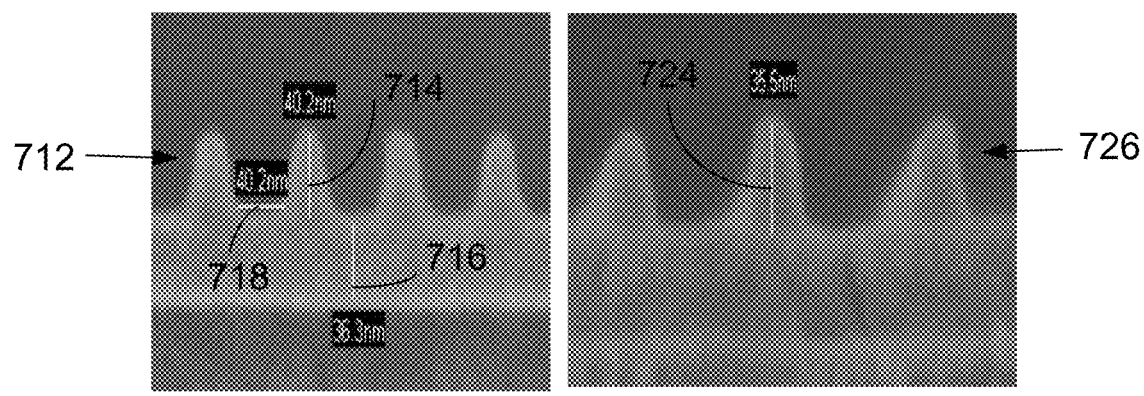

FIG. 7B is an exemplary image 710 of the side-view of structures 712 after a CTO of 60 degrees C. for 60 seconds an energy level of 17 mJ/cm². At this energy level, CTO of 60 degrees C. for 60 seconds causes a reduction in the CD height 714 to 40.2 nm, distance 718 between structures 712 is 40.2 nm and the layer 716 immediately underneath the structures 712 is 36.3 nm.

FIG. 7C is an exemplary image 720 of the side-view of structures 726 after a CTO of 60 degrees C. for 60 seconds an energy level of 20 mJ/cm². The basic difference is the CD height 724 is 35.5 nm.

Figures 7D, 7E:
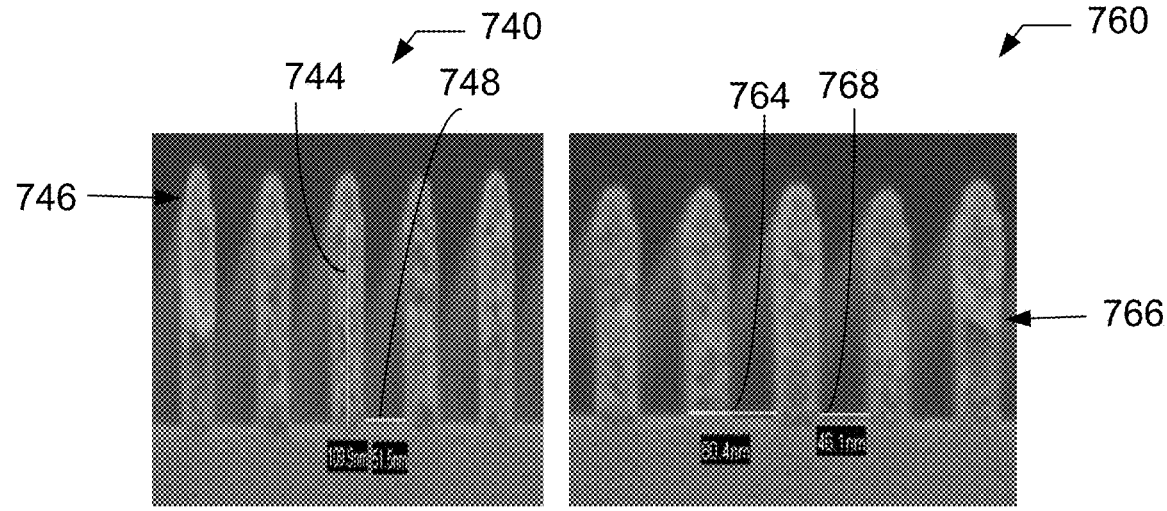
FIG. 7D is an exemplary image of the side-view of structures after an etch or OPL open a CTO of 60 degrees C. for 60 seconds process with an energy level of 20 mJ/cm$^2$.
FIG. 7E is an exemplary image of the side-view of structures after a development process with an energy level of 20 mJ/cm$^2$.

FIG. 7D is an exemplary image 740 of the side-view of structures 746 after an etch or organic planarization layer (OPL) open. After an etch or OPL open at an energy level of 17 mJ/cm², the structures 746 exhibited a rounded conical top profile and the distance between structures 748 was 51.5 nm and the height of the structures 744 are about 109.9 nm.

FIG. 7E is an exemplary image 760 of the side-view of structures 766 after an etch or organic planarization layer (OPL) open at an energy level of 20 mJ/cm² where the structures have grown more and distance between structures 766 was 46.1 nm, which is what was expected loss due to the growth. The distance and the CD 764 of the structures 766 was 80.4 nm.

FIG. 8A is an exemplary image 800 of the top-down view of structures and highlights the line width roughness (LWR) post lithography. Based on tests and measurements conducted by the inventors, the LWR 804 of the structures 808 post lithography was 4.82 nm. FIG. 8B is an exemplary image 820 of the top-down view of structures and highlights the LWR improvement post lithography and post etch smoothing. Based on the tests and measurements, the LWR 824 of the structures 828 post lithography and post etch smoothing is 3.58 nm and the percentage improvement of the LWR is 25.7%.

FIG. 8C is an exemplary image 840 of the top-down view of structures 848 and highlights the LWR 844 post lithography. The LWR of the structures 848 based on measurements conducted by the inventors was 4.42 nm. FIG. 8D is an exemplary image 860 of the top-down view of structures and highlights the LWR improvement post smoothing. The LWR 864 of the structures 868 post lithography was 3.71 nm and the percentage improvement of the LWR was 23.0%. FIG. 8E is an exemplary image 880 of the top-down view of structures 888 and highlights the LWR improvement post smoothing and post etch smoothing. Based on the tests and measurements, the LWR 884 of the structures 888 post lithography and post etch smoothing was 3.19 nm and the percentage improvement of the LWR compared to post lithography was 33.8%. By using the shrink and growth method of patterning the structures, a reduction of sensitivity of EUV process was implemented while the resolution was maintained, and the LWR was improved by about 33%.

Figure 9A:
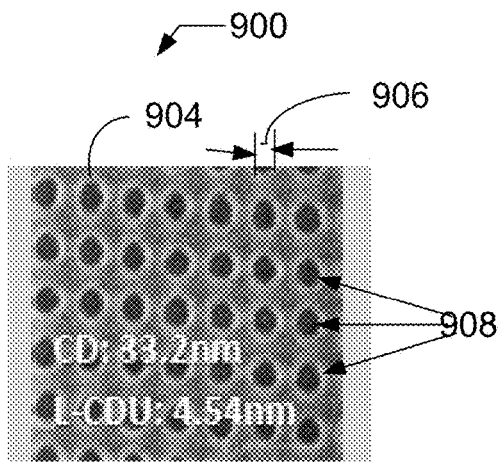
FIG. 9A is an exemplary image of the top-down view of structures that highlights the contact edge roughness baseline measurement with conventional post lithography.
Figure 9B:
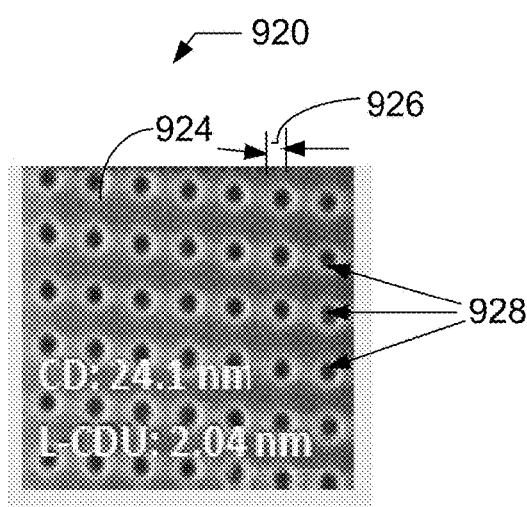
FIG. 9B is an exemplary image of the top-down view of structures that highlights the contact edge roughness improvement conventional post etch smoothing.

FIG. 9A is an exemplary image 900 of the top-down view of contact hole C/H structures 908 and highlights the line CD uniformity (L-CDU) and contact edge roughness (CER) improvement with conventional post lithography. Based on tests and measurements conducted by the inventors, the CD 906 of the structures was 33.2 nm, CER 904 was 2.19 nm, and the L-CDU was 4.54 nm, referred to as baseline metrics. Referring now to FIG. 9B, FIG. 9B is an exemplary image 920 of the top-down view of structures 928 and highlights the CER improvement post etch with etch smoothing. Based on the tests and measurements, the CD 926 of the structures was 24.1 nm, CER 924 was 1.35 nm, and the L-CDU was 2.04 nm. By using the shrink and growth method of patterning the structures, a reduction of sensitivity of EUV process was implemented while the resolution was maintained, and the CER improved by about 38% and the L-CDU improved by about 55% compared to the baseline metrics.

Another alternate embodiment can include two steps: (1) a set of CER and L-CDU improvement using stack-optimized and track-based smoothing and (2) a set of CER and L-CDU improvement using etch with etch smoothing. These two steps are described in relation to FIG. 9C and FIG. 9D.

Figure 9C:
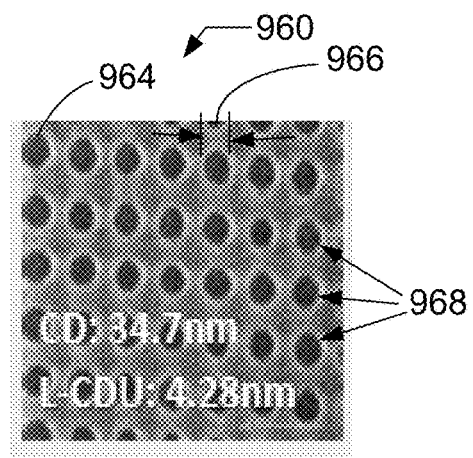
FIG. 9C is an exemplary image of the top-down view of structures and highlights the contact edge roughness improvement post track-based smoothing.

Referring now to FIG. 9C, FIG. 9C depicts an exemplary image 960 of the top-down view of structures 968 and highlights the CER improvement using the etch smoothing process. By optimizing the selected operating variables of the deposition and etch smoothing processes, there was a reduction of sensitivity of EUV process while the resolution was maintained and the CER was improved. Based on tests and measurements conducted by the inventors, the CD 966 of the structures was 34.7 nm, CER 964 was 1.84 nm, and the L-CDU was 4.28 nm or an improvement of the CER by about 32% and the L-CDU improved by about 54% compared to the baseline metrics.

Figure 9D:
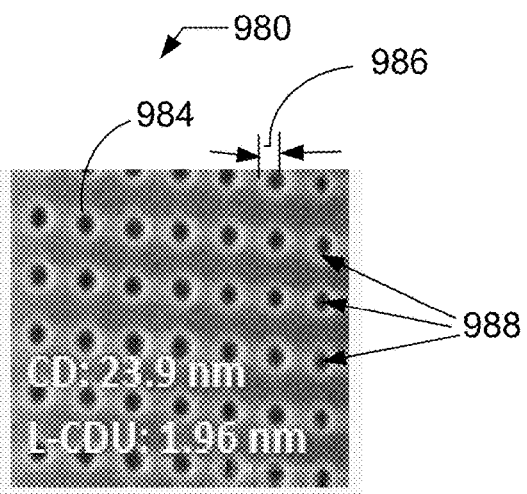
FIG. 9D is an exemplary image of the top-down view of structures and highlights the contact edge roughness improvement post track-based smoothing and etch smoothing.

Referring now to FIG. 9D, FIG. 9D is an exemplary image 980 of the top-down view of structures 988 and highlights the CER improvement using shrink and growth processes. Based on tests and measurements conducted by the inventors, the CD 986 of the structures was 23.9 nm, CER 984 was 1.24 nm, and the L-CDU was 1.96 nm. By optimizing the selected operating variables of the shrink and growth processes, there was a reduction of sensitivity of EUV process while the resolution was maintained, and the CER improved by about 43% and the L-CDU improved by about 57% from the baseline metrics.

Figure 10A:
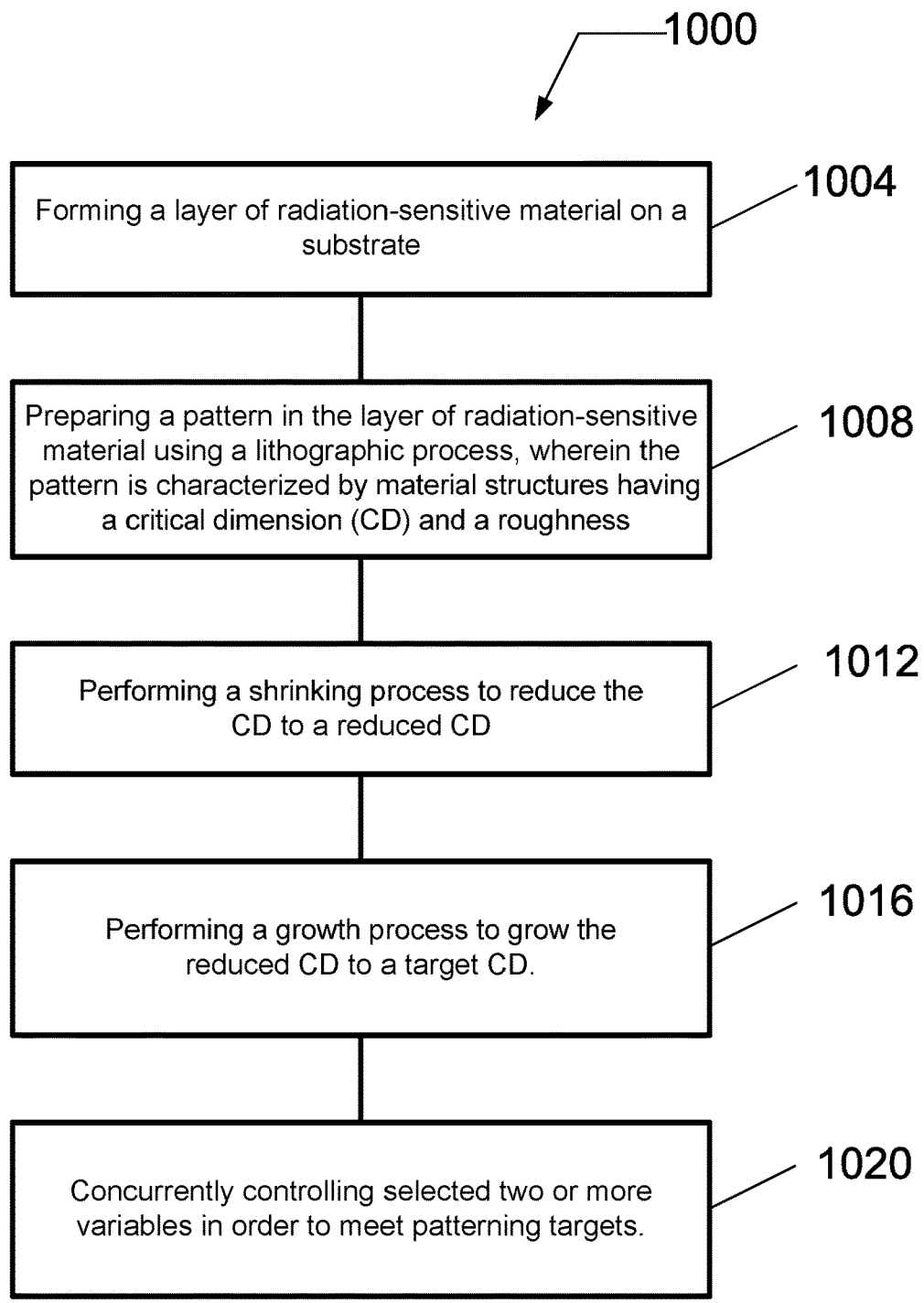
FIG. 10A provides a flow chart illustrating a method of patterning a substrate with a line and space structure using shrink and growth processes according to an embodiment.

FIG. 10A provides a flow chart 1000 illustrating a method of patterning a substrate with a line and space structure according to an embodiment. In operation 1004, a layer of radiation-sensitive material is formed on a substrate. The layer of radiation-sensitive material 120 may include a photo-resist. For example, the layer of radiation-sensitive material may comprise an EUV (extreme ultraviolet) resist, or an electron beam sensitive resist. Furthermore, for example, the first layer of radiation-sensitive material may comprise a thermal freeze photo-resist, an electromagnetic (EM) radiation freeze photo-resist, or a chemical freeze photo-resist. In one embodiment, an EUV resist may be characterized as a photo-sensitive material whose solubility in basic solutions changes when exposed to EM radiation at EUV wavelengths, e.g., EM wavelengths ranging from about 11 nm to about 14 nm.

The layer of radiation-sensitive material may be formed by spin-coating the material onto a substrate. The first layer of radiation-sensitive material may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more first post-application bakes (PAB) to heat the substrate and one or more cooling cycles, following the one or more first PABs, to cool the substrate.

In operation 1008, a pattern is prepared in the layer of radiation-sensitive material using a lithographic process, wherein the pattern is characterized by material structures having a critical dimension (CD) and a roughness. The substrate having the layer of radiation-sensitive material is aligned at an alignment position in a radiation exposure system and imaged with radiation having an image pattern.

The radiation exposure system may include a dry or wet photo-lithography system. The image pattern may be formed using any suitable conventional stepping lithography system, or scanning lithography system. For example, the photo-lithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the image pattern may be formed using an electron beam lithography system.

In order to achieve the goal of high-volume manufacturing, also referred to above as enabling throughput, the photo-lithography tool must achieve about 50 wafers per hour or higher. The throughput of the photo-lithography tool is a function of the EUV energy, thus, for a higher EUV dose, the lesser the number of substrates per hour processed. Instead of operating at an increased EUV dose, exposure is performed at a reduced EUV dose to achieve adequate throughput and this invention reduces the EUV energy in order to get around the RLS tradeoff as mentioned above is circumvented by corrective steps, such as CD shrink and CD growth.

In an embodiment, the EUV resist sensitivity reduction was done by reducing the exposure time of the EUV source and tests included the process of record (POR) used as a base line for comparison and different percentage energy level reduction. The reduction of sensitivity through EUV energy reduction in the irradiation of the pattern, (through reduction of exposure time of the resist), produced a significant increase in the EUV overall throughput that is substantially in the range of 50 or more wafers per hour needed for high volume manufacturing. In an embodiment, the sensitivity was reduced by reducing the EUV energy. Other embodiments may reduce the sensitivity by adjusting the intensity of the EUV source and/or the exposure time. As mentioned above, one way of reducing energy is by reducing the exposure time to the EUV energy. The EUV dose and intensity of EUV light are correlated to the exposure time, which can be determined using the following equation:

Calculated exposure time$(s)$=Dose$(mJ/cm^2)$/Intensity $(mW/cm^2)$  Eq. 1.0

Given a constant intensity of the EUV source, the calculated exposure time would go down as the EUV dose went down, increasing the number of substrates processed per hour.

In operation 1012, a shrink process is performed to reduce the CD to a reduced CD. The shrink process can use a solvent vapor process, chemical spin coating process, or a resist development process. These processes are well known by people in the art and consequently will not be discussed in detail. The inventors found out that with the shrink process using lower energy or less time, there was a degradation in the image quality of the structures, the degradation included bridging, scamming, footing, and significant line width roughness (LWR), line edge roughness (LER) for lines and space structures that had to be reduced. With contact holes and the like, contact edge roughness (CER) and line-CD uniformity (L-CDU) also were significant and required reduction.

In operation 1016, a growth process is performed to grow the reduced CD to a target CD. Growing a CD for a line and space structure can utilize a solvent vapor process, a chemical spin coating process, or an etch process. The etch process can utilize an organic or inorganic polymer material where the material can be processed similar to solvent vapor or a chemical spin coat. During or immediately after the CD growth process, the CD, LWR, LER, for a line and space structure or CER and L-CDU can be measured continuously or at intervals where the data is used to control the processes.

In operation 1020, concurrently controlling selected two or more variables in order to meet patterning targets. The selected variables can comprise coating time, coating spin speed, coating acceleration, etchant dispense rate, deionized water dispense rate, depth of focus (DOF) margin, shrinkage range (nm), mixing bake temperature, hard mask film thickness range, CD, LWR, LER for line and space structures and CD, CER, and L-CDU contact hole structures. The data obtained from sensors and meteorology devices can be used in a controller, discussed in relation to FIG. 12, to control the processes in order to meet patterning targets.

Figure 10B:
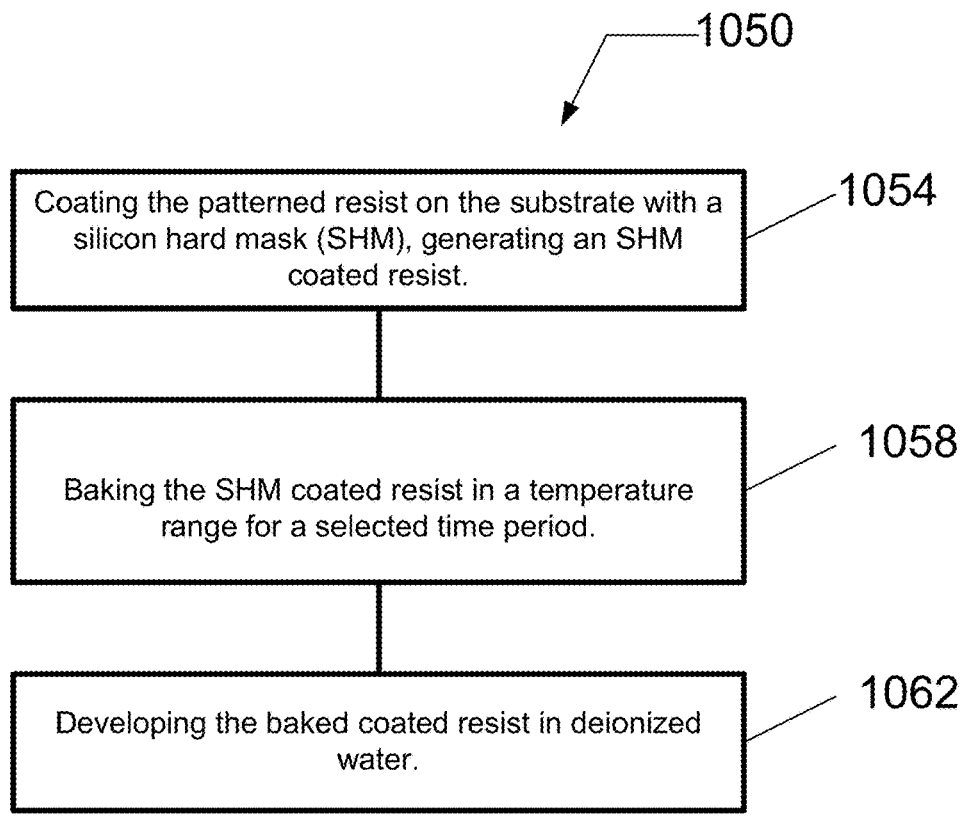
FIG. 10B provides a flow chart illustrating a method of performing a CD shrink process according to an embodiment.

FIG. 10B depicts an exemplary flow chart 1050 illustrating a method of performing a shrink process such as operation 1012 in FIG. 10A. In operation 1020, the patterned resist on the substrate is coated with silicon hard mask (SHM), generating a silicon hard mask coated resist. In operation 1020, the silicon hard mask coated resist is baked in a temperature range for a selected time period. In operation 1020, the baked coated resist is developed in deionized water. Operation 1054, 1058, and 1062 are known by people in the art and shall not be discussed in detail. Other exemplary shrink processes can also be used.

Figure 11:
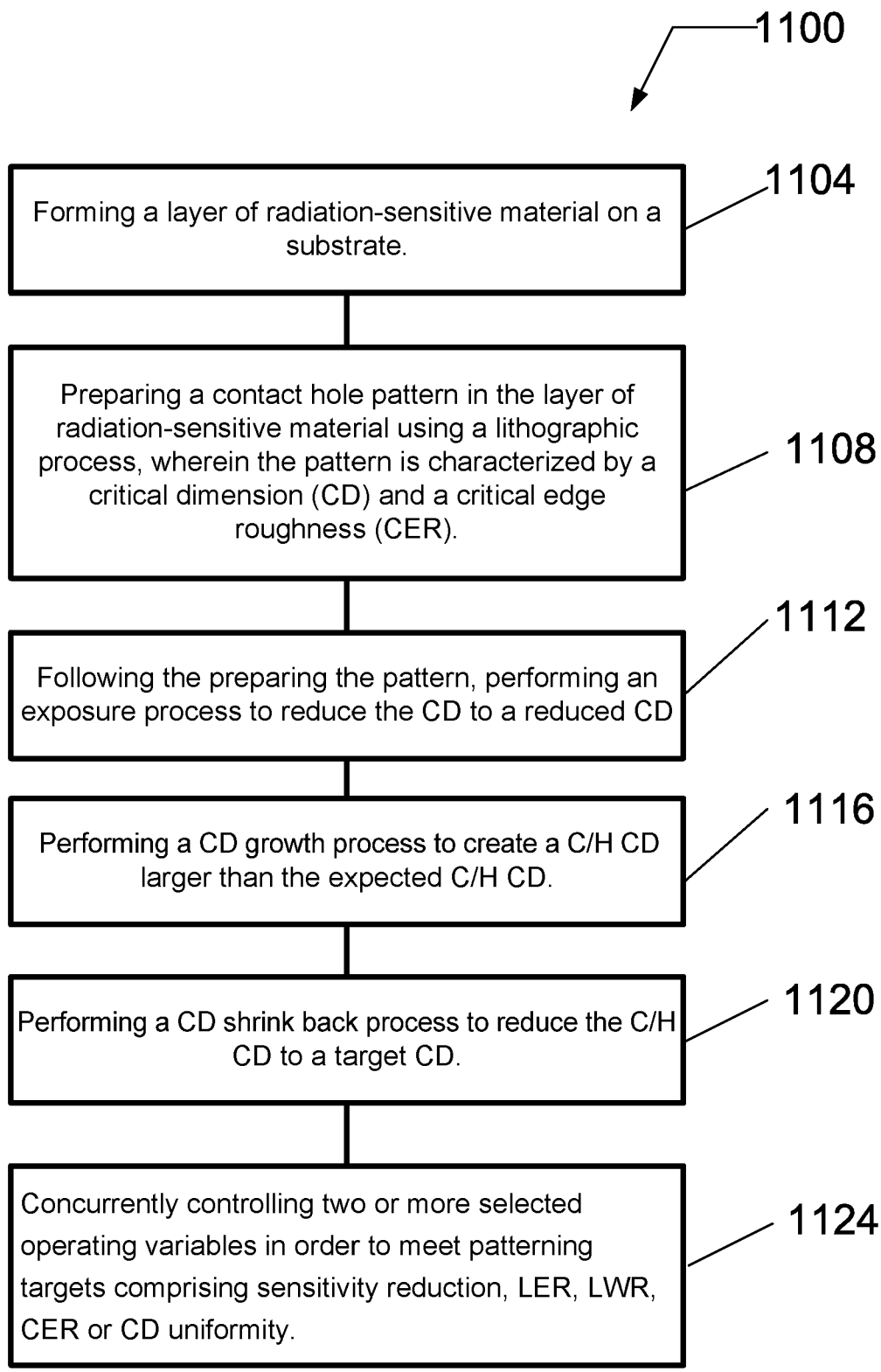
FIG. 11 provides a flow chart illustrating a method of patterning a substrate with a contact hole (C/H) structure using a shrink and growth processes according to an embodiment.

FIG. 11 depicts an exemplary flow chart 1100 illustrating a method of patterning a substrate with a contact hole (C/H) structure according to an embodiment. In operation 1104, a layer of radiation-sensitive material is formed on a substrate. In operation 1108, a contact hole pattern in the layer of radiation-sensitive material is fabricated, using a lithographic process wherein the pattern is characterized by a critical dimension (CD) and a critical edge roughness (CER).

In operation 1112, following the preparing the pattern, an exposure process is performed to reduce the CD to a reduced CD. In operation 1116, a CD growth process (which shrinks material structures between the holes) is performed to create a C/H CD larger than the expected C/H CD. In operation 1120, a CD shrink back process (which grows the material structures between the holes) is performed to reduce the C/H CD to a target CD. The CD growth process (which is a material shrink process) can use a solvent vapor process, chemical spin coating process, or a resist development process. These processes are well known by people in the art and consequently will not be discussed in detail. The inventors found out that with the shrink process using lower energy or less time, there was a degradation in the image quality of the contact hole structures, the degradation included bridging, scamming, footing, and contact edge roughness (CER) and line-CD uniformity (L-CDU) also were significant and required reduction.

In operation 1124, concurrently controlling two or more selected operating variables in order to meet patterning targets comprising sensitivity reduction, LER, LWR, CER or line CD uniformity (L-CDU). The selected variables can comprise coating time, coating spin speed, coating acceleration, etchant dispense rate, deionized water dispense rate, DOF margin, shrinkage range (nm), mixing bake temperature, hard mask film thickness range, CD, CER, and L-CDU for contact hole structures. The data obtained from sensors and meteorology devices can be used in a controller to control the processes in order to meet patterning targets.

Figure 12:
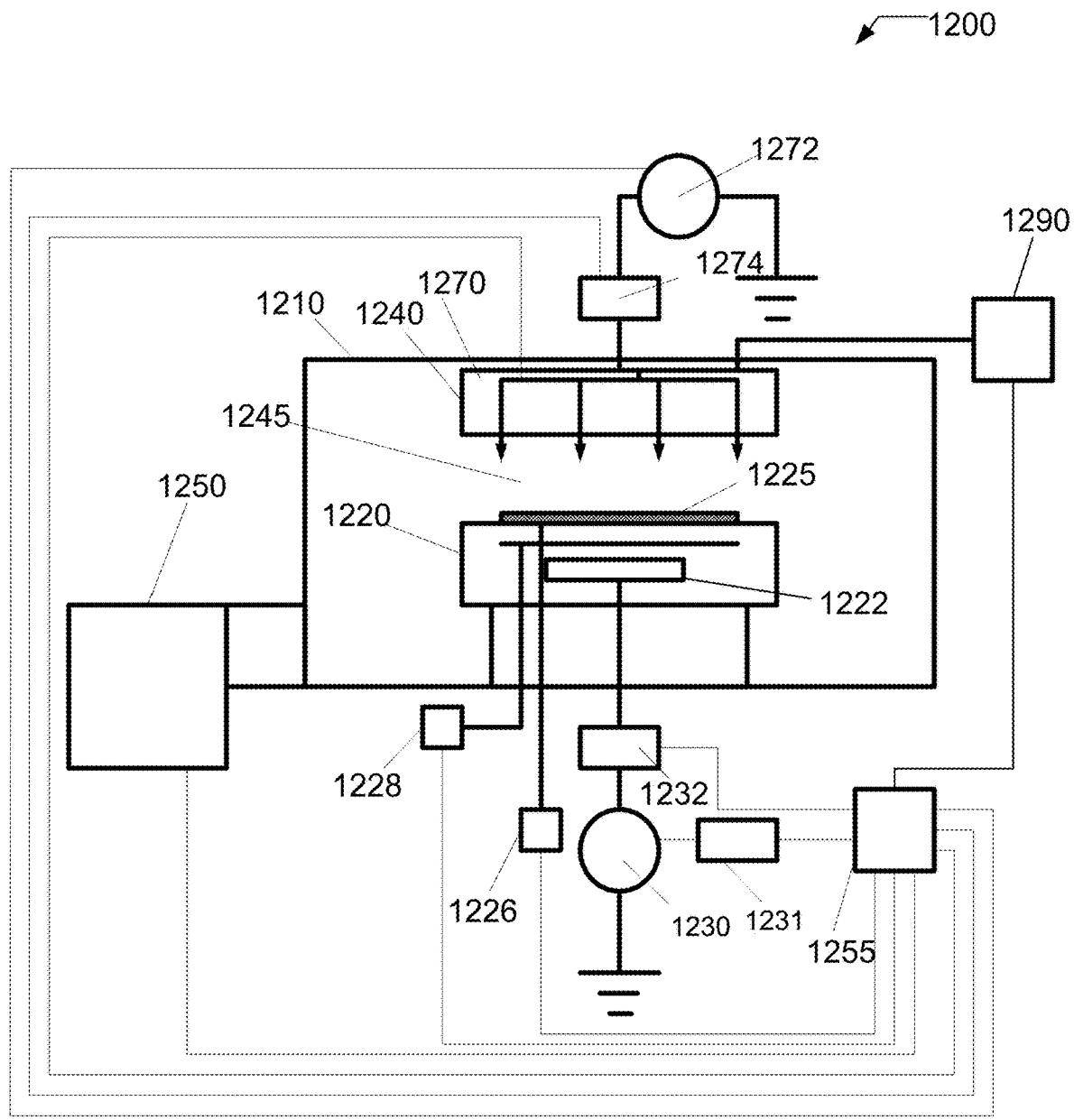
FIG. 12 is an exemplary systems chart for performing the method of extreme ultra-violet sensitivity reduction using shrink and growth in an embodiment of the present invention.

FIG. 12 depicts an exemplary patterning system chart 1200 for performing the method of extreme ultra-violet sensitivity reduction using shrink and growth in an embodiment of the present invention. A patterning system 1200 configured to perform the above identified process conditions is depicted in FIG. 12 comprising a plasma processing chamber 1210, substrate holder 1220, upon which a substrate 1225 to be processed is affixed, and vacuum pumping system 1250. Substrate 1225 can be a semiconductor substrate, a wafer, a flat panel display, or a liquid crystal display. Plasma processing chamber 1210 can be configured to facilitate the generation of plasma in plasma processing region 1245 in the vicinity of a surface of substrate 1225. An ionizable gas or mixture of process gases is introduced via a gas distribution system 1240. For a given flow of process gas, the process pressure is adjusted using the vacuum pumping system 1250. Plasma can be utilized to create materials specific to a pre-determined materials process, and/or to aid the removal of material from the exposed surfaces of substrate 1225. The patterning system 1200 can be configured to process substrates of any desired size, such as 200 mm substrates, 300 mm substrates, or larger.

Substrate 1225 can be affixed to the substrate holder 1220 via a clamping system 1228, such as a mechanical clamping system or an electrical clamping system (e.g., an electrostatic clamping system). Furthermore, substrate holder 1220 can include a heating system (not shown) or a cooling system (not shown) that is configured to adjust and/or control the temperature of substrate holder 1220 and substrate 1225. The heating system or cooling system may comprise a re-circulating flow of heat transfer fluid that receives heat from substrate holder 1220 and transfers heat to a heat exchanger system (not shown) when cooling, or transfers heat from the heat exchanger system to substrate holder 1220 when heating. In other embodiments, heating/cooling elements, such as resistive heating elements, or thermo-electric heaters/coolers can be included in the substrate holder 1220, as well as the chamber wall of the plasma processing chamber 1210 and any other component within the plasma processing patterning system 1200.

Additionally, a heat transfer gas can be delivered to the backside of substrate 1225 via a backside gas supply system 1226 in order to improve the gas-gap thermal conductance between substrate 1225 and substrate holder 1220. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 1225.

In the embodiment shown in FIG. 12, substrate holder 1220 can comprise an electrode 1222 through which RF power is coupled to the processing plasma in plasma processing region 1245. For example, substrate holder 1220 can be electrically biased at a RF voltage via the transmission of RF power from a RF generator 1230 through an optional impedance match network 1232 to substrate holder 1220. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 1222 at a RF voltage may be pulsed using pulsed bias signal controller 1231. The RF power output from the RF generator 1230 may be pulsed between an off-state and an on-state, for example. Alternately, RF power is applied to the substrate holder electrode at multiple frequencies. Furthermore, impedance match network 1232 can improve the transfer of RF power to plasma in plasma processing chamber 1210 by reducing the reflected power. Match network topologies (e.g. L-type, π-type, T-type, etc.) and automatic control methods are well known to those skilled in the art.

Gas distribution system 1240 may comprise a showerhead design for introducing a mixture of process gases. Alternatively, gas distribution system 1240 may comprise a multi-zone showerhead design for introducing a mixture of process gases and adjusting the distribution of the mixture of process gases above substrate 1225. For example, the multi-zone showerhead design may be configured to adjust the process gas flow or composition to a substantially peripheral region above substrate 1225 relative to the amount of process gas flow or composition to a substantially central region above substrate 1225.

Vacuum pumping system 1250 can include a turbo-molecular vacuum pump (TMP) capable of a pumping speed up to about 8000 liters per second (and greater) and a gate valve for throttling the chamber pressure. In conventional plasma processing devices utilized for dry plasma etching, a 1200 to 3000 liters per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 1210.

As mentioned above, the controller 1255 can comprise a microprocessor, memory, and a digital I/O port capable of generating control voltages sufficient to communicate and activate inputs to plasma processing system 1200 as well as monitor outputs from plasma processing system 1200. Moreover, controller 1255 can be coupled to and can exchange information with RF generator 1230, pulsed bias signal controller 1231, impedance match network 1232, the gas distribution system 1240, the gas supply 1290, vacuum pumping system 1250, as well as the substrate heating/cooling system (not shown), the backside gas supply system 1226, and/or the electrostatic clamping system 1228. For example, a program stored in the memory can be utilized to activate the inputs to the aforementioned components of plasma processing system 1200 according to a process recipe in order to perform a plasma assisted process, such as a plasma etch process, on substrate 1225.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for patterning substrates in a patterning system having a throughput in substrates per hour, the method comprising for each of the substrates:
   forming a layer of radiation-sensitive material on the substrate;
   preparing a pattern in the layer of radiation-sensitive material using an extreme ultra violet (EUV) lithographic process, the pattern being characterized by material structures having a critical dimension (CD) and a roughness;
   following the preparing the pattern, performing a shrink process to remove material from the material structures to reduce the CD to a reduced CD; and following the performing the shrink process, performing a growth process to add material to the material structures to grow the reduced CD to a target CD;

wherein the method for each of the substrates has a patterning time that enables the patterning system to operate with a throughput of 50 substrates per hour or more while controlling the line width roughness (LWR) and line edge roughness (LER) of each of the substrates.

2. The method of claim 1 wherein the performing the CD shrink process comprises:

coating the pattern with a hard mask, the coating generating a hard mask coated pattern;

baking the hard mask coated pattern in a temperature range for a selected time period, the baking generating a baked coated pattern; and developing the baked coated pattern in deionized water (DIW).

3. The method of claim 2 wherein the baking the hard mask coated pattern is performed in a temperature range from 110 to 170 degrees C. for 70 seconds or less.

4. The method of claim 3 wherein the shrink process reduces the CD by 10 to 15 nm.

5. The method of claim 3 wherein the hard mask coating is performed with a hark mask thickness in a range from 60 to 150 nm.

6. The method of claim 3 wherein the developing the baked coated pattern is performed in 60 sec or less.

7. The method of claim 1 wherein the growth process is performed preceding or following shrink process.

8. The method of claim 1 wherein the shrink process is performed using solvent vapor process or a chemical spin coating process.

9. The method of claim 1, wherein the shrink process is performed using resist development process or an etch process.

10. The method of claim 1, wherein the performing the growth process is performed using a solvent vapor process, a chemical spin coating process, or an etch process.

11. The method of claim 1 further comprising:

concurrently controlling two or more selected operating variables in order to meet patterning targets.

12. The method of claim 11 wherein the two or more selected operating variables comprise coating time, coating spin speed, coating acceleration, etchant dispense rate, deionized water dispense rate, depth of focus (DOF) margin, shrinkage range (nm), mixing bake temperature, and hard mask film thickness range.

13. The method of claim 12 wherein the LER and LWR after the growth process is lower by 11 to 20% compared to the LER and LWR after the shrink process.

14. A method for patterning a substrate, comprising:

forming a layer of radiation-sensitive material on a substrate;

preparing a contact hole (C/H) pattern in the layer of radiation-sensitive material using a lithographic process, the pattern being characterized by a critical dimension (CD) and a contact edge roughness (CER);

following the preparing the C/H pattern, performing an exposure process to a lower energy than the target energy, the exposure process forming a smaller C/H CD than the expected C/H CD, performing a CD growth process to remove material adjacent to the C/H pattern to create a C/H CD larger than the expected C/H CD; and performing a CD shrink back process to add material adjacent to the C/H pattern to reduce the C/H CD to a target CD.

15. The method of claim 14 wherein the performing the CD growth process is performed using a solvent vapor process, a chemical spin coating process, a resist development process or an etch process.

16. The method of claim 14 wherein the performing the CD shrink back process is performed using a solvent vapor process, a chemical spin coating process, or an etch process.

17. The method of claim 14 further comprising:

concurrently controlling two or more selected operating variables in order to meet patterning targets comprising sensitivity reduction, CER and/or CD uniformity (CDU).

18. The method of claim 17 wherein the two or more selected operating variables comprise coating time, coating spin speed, coating acceleration, etchant dispense rate, deionized water dispense rate, depth of focus (DOF) margin, mixing bake degrees per 60 sec, shrinkage (nm), mixing bake temperature, hard mask film thickness range, growth process time, and/or shrink back process time.

19. The method of claim 14 wherein the CER is reduced by 15 to 33% and the throughput is 50 or more substrates per hour.

20. The method of claim 14 further comprising:

utilizing the pattern in the layer of radiation-sensitive material as a mandrel for performing a sidewall image transfer process and the layer of radiation-sensitive material comprises an EUV (extreme ultraviolet) resist.

* * * * *

UNITED STATES PATENT AND TRADEMARK OFFICE
CERTIFICATE OF CORRECTION

PATENT NO. : 10,935,889 B2
APPLICATION NO. : 15/152950
DATED : March 2, 2021
INVENTOR(S) : Lior Huli et al.

Page 1 of 1

It is certified that error appears in the above-identified patent and that said Letters Patent is hereby corrected as shown below:

In the Specification

Column 1, Lines 6-7, "The invention relates to a method and systems for patterning a thin film on a" should be --The invention relates to a method and system for patterning a thin film on a--.

Column 3, Line 60, "PTO typed new paragraph indent" should be --no new paragraph indent--.

Column 4, Lines 8-12, "Reference throughout this specification to ... means that ..., but do not denote" should be --Reference throughout this specification to ... means that ..., but does not denote--.

Column 7, Line 17, "nm and the height of the structures 744 are about 109.9 nm." should be --nm and the height of the structures 744 is about 109.9 nm.--.

Column 11, Line 36, "the plasma processing patterning system 1200." should be --the patterning system 1200.--.

In the Claims

Column 13, Lines 10-11, Claim 2, "The method of claim 1 wherein the performing the CD shrink process comprises:" should be --The method of claim 1 wherein the performing the shrink process comprises:--.

Column 14, Lines 1-2, Claim 13, "The method of claim 12 wherein the LER and LWR after the growth process is lower by" should be --The method of claim 12 wherein the LER and LWR after the growth process are lower by--.

Signed and Sealed this
Third Day of August, 2021

Drew Hirshfeld
*Performing the Functions and Duties of the*
*Under Secretary of Commerce for Intellectual Property and*
*Director of the United States Patent and Trademark Office*